(12) United States Patent
Boroson et al.

(10) Patent No.: US 7,091,605 B2
(45) Date of Patent: Aug. 15, 2006

(54) HIGHLY MOISTURE-SENSITIVE ELECTRONIC DEVICE ELEMENT AND METHOD FOR FABRICATION

(75) Inventors: Michael L. Boroson, Rochester, NY (US); John Schmittendorf, Rochester, NY (US); Jeffrey P. Serbicki, Holley, NY (US)

(73) Assignee: Eastman Kodak Company, Rochester, NY (US)

( * ) Notice: Subject to any disclaimer, the term of this patent is extended or adjusted under 35 U.S.C. 154(b) by 106 days.

(21) Appl. No.: 09/957,851

(22) Filed: Sep. 21, 2001

(65) Prior Publication Data

US 2003/0057574 A1 Mar. 27, 2003

(51) Int. Cl.
*H01L 23/34* (2006.01)

(52) U.S. Cl. .............. 257/723; 257/787; 257/788; 257/792; 257/433; 257/E23.002; 257/E23.137

(58) Field of Classification Search .......... 257/723, 257/787, 788, 792, 794, 433, 40, E23.002, 257/E23.137
See application file for complete search history.

(56) References Cited

U.S. PATENT DOCUMENTS

| | | | | |
|---|---|---|---|---|
| 4,063,349 A | * | 12/1977 | Passler et al. | 29/841 |
| 4,081,397 A | | 3/1978 | Booe | |
| 4,352,119 A | * | 9/1982 | Bardens et al. | 257/682 |
| 4,357,557 A | * | 11/1982 | Inohara et al. | 313/509 |
| 4,426,769 A | * | 1/1984 | Grabbe | 29/832 |
| 4,630,095 A | * | 12/1986 | Otsuka et al. | 257/660 |
| 4,644,384 A | * | 2/1987 | Charoensakvirochana et al. | 438/116 |
| 4,769,345 A | * | 9/1988 | Butt et al. | 29/827 |
| 4,873,615 A | * | 10/1989 | Grabbe | 361/742 |
| 4,977,009 A | * | 12/1990 | Anderson et al. | 428/76 |
| 5,239,228 A | | 8/1993 | Taniguchi et al. | |
| 5,294,870 A | * | 3/1994 | Tang et al. | 313/504 |
| 5,304,419 A | | 4/1994 | Shores | |
| 5,401,536 A | | 3/1995 | Shores | |
| 5,482,896 A | * | 1/1996 | Tang | 438/28 |
| 5,543,364 A | * | 8/1996 | Stupian et al. | 438/115 |
| 5,591,379 A | * | 1/1997 | Shores | 252/194 |
| 5,610,438 A | * | 3/1997 | Wallace et al. | 257/682 |
| 5,652,067 A | * | 7/1997 | Ito et al. | 428/690 |
| 5,771,562 A | | 6/1998 | Harvey, III et al. | |
| 5,773,931 A | * | 6/1998 | Shi et al. | 313/509 |
| 5,811,177 A | * | 9/1998 | Shi et al. | 428/209 |
| 5,821,692 A | * | 10/1998 | Rogers et al. | 313/512 |
| 5,841,190 A | * | 11/1998 | Noda et al. | 257/678 |
| 5,874,804 A | * | 2/1999 | Rogers | 313/512 |
| 5,880,403 A | * | 3/1999 | Czajkowski et al. | 174/35 R |
| 5,929,515 A | * | 7/1999 | Greiff et al. | 257/682 |
| 6,037,712 A | * | 3/2000 | Codama et al. | 313/498 |
| 6,226,890 B1 | | 5/2001 | Boroson et al. | |
| 6,280,559 B1 | * | 8/2001 | Terada et al. | 156/295 |
| 6,284,342 B1 | * | 9/2001 | Ebisawa et al. | 428/69 |

(Continued)

FOREIGN PATENT DOCUMENTS

EP 0 776 147 A1 5/1997

*Primary Examiner*—Eugene Lee
(74) *Attorney, Agent, or Firm*—Raymond L. Owens

(57) ABSTRACT

A highly moisture-sensitive element and method of making such element includes an encapsulation enclosure encapsulating all of the highly moisture-sensitive electronic devices on a substrate and a sealing material positioned between the substrate and the encapsulation enclosure to form a complete seal between the substrate and the encapsulation enclosure around each highly moisture-sensitive electronic device or around groups of highly moisture-sensitive electronic devices.

20 Claims, 8 Drawing Sheets

U.S. PATENT DOCUMENTS 6,297,549 B1 * 10/2001 Hiyoshi ..................... 257/703
6,320,257 B1 * 11/2001 Jayaraj et al. ............. 257/723
6,423,575 B1 *  7/2002 Tran et al. ................. 438/115
6,737,176 B1 *  5/2004 Otsuki et al. .............. 428/690
6,784,612 B1 *  8/2004 Park et al. ................. 313/512
6,911,667 B1 *  6/2005 Pichler et al. ............. 257/40

* cited by examiner

HIGHLY MOISTURE-SENSITIVE ELECTRONIC DEVICE ELEMENT AND METHOD FOR FABRICATION

FIELD OF THE INVENTION

The present invention relates to control of moisture inside a packaged electronic device and relates particularly to highly moisture-sensitive electronic device elements having multiple highly moisture-sensitive electronic devices and methods for their fabrication to prevent premature device failure or premature degradation of device performance.

BACKGROUND OF THE INVENTION

In manufacturing, electronic devices are typically produced by fabricating large substrates containing multiple electronic devices. These substrates are typically selected from the group consisting of glass, plastic, metal, ceramic, and silicon or other semiconductor materials, or combinations of these materials. The substrates may be rigid or flexible and may be handled as individual units or continuous rolls. The primary reason for fabricating multiple electronic devices on large individual substrates or a continuous roll substrate is to reduce manufacturing cost by decreasing handling, increasing throughput, and increasing yield. In the microelectronics industry silicon wafer processing has increased from 2 inch wafers to 12 inch wafers resulting in significant cost reductions. In the liquid crystal display (LCD) industry glass substrate processing has increased from 300 mm×400 mm substrates to over 600 mm×700 mm substrates with the same result. In manufacturing of highly moisture-sensitive electronic devices, such as organic light-emitting devices (OLED), polymer light-emitting devices, charge-coupled device (CCD) sensors, and micro-electro-mechanical sensors (MEMS), the same economies of scale are achieved by fabricating large individual substrates or a continuous roll substrate with multiple highly moisture-sensitive electronic devices. FIG. 1A shows an unencapsulated highly moisture-sensitive electronic device element 14 containing multiple highly moisture-sensitive electronic devices 12 on an individual substrate 10, and FIG. 1B is a schematic sectional view of the highly moisture-sensitive electronic device element 14 taken along section line 1B—1B of FIG. 1A. Fabricating large individual substrates or a continuous roll substrate with multiple highly moisture-sensitive electronic devices, however, introduces a problem that is not important for less moisture-sensitive electronic devices in that highly moisture-sensitive devices must be protected from even short term exposure to moisture during fabrication.

Typical electronic devices require humidity levels in a range of about 2500 to below 5000 parts per million (ppm) to prevent premature degradation of device performance within a specified operating and/or storage life of the device. Control of the environment to this range of humidity levels within a packaged device is typically achieved by encapsulating the device or by sealing the device and a desiccant within a cover. Desiccants such as, for example, molecular sieve materials, silica gel materials, and materials commonly referred to as Drierite materials are used to maintain the humidity level within the above range. Short term exposure to humidity levels greater than 2500 ppm during the fabrication and encapsulation of these types of electronic devices typically does not cause measurable degradation of device performance. For this reason encapsulation of these types of electronic devices is done after the electronic devices are separated from the initial substrate.

In the manufacture of liquid crystal displays the electronics and the liquid crystal materials are not highly moisture-sensitive; therefore, the process for encapsulating the electronics and the liquid crystal materials does not require protection from ambient moisture during fabrication. FIG. 2A shows a typical multiple LCD element 28 before separation into single LCD devices, and FIG. 2B is a schematic sectional view of the multiple LCD element 28 taken along section line 2B—2B of FIG. 2A. In LCD manufacturing the LCD back-plane 22 and the LCD front-plane 24 contain multiple LCD devices. The LCD back-plane 22 and the LCD front-plane 24 are bonded together with a sealing material 20 that surrounds each LCD device except for a gap in the sealing material 20. After fabrication of the multiple LCD element 28 the LCD devices are separated and filled with liquid crystal material. After filling the LCD devices, the gap in the sealing material 20 is sealed with a gap sealing material to retain the liquid crystal material and to protect the LCD back-plane electronics 26 and the liquid crystal material from moisture. Because LCD devices are not highly moisture-sensitive, the separation process of the multiple LCD element is typically performed in an ambient air environment with no measurable degradation of the LCD devices.

Particular highly moisture-sensitive electronic devices, for example, organic light-emitting devices (OLED) or panels, polymer light-emitting devices, charge-coupled device (CCD) sensors, and micro-electro-mechanical sensors (MEMS) require humidity control to levels below about 1000 ppm and some require humidity control below even 100 ppm. Such low levels are not achievable with desiccants of silica gel materials and of Drierite materials. Molecular sieve materials can achieve humidity levels below 1000 ppm within an enclosure if dried at a relatively high temperature. However, molecular sieve materials have a relatively low moisture capacity at humidity levels at or below 1000 ppm, and the minimum achievable humidity level of molecular sieve materials is a function of temperature within an enclosure: moisture absorbed, for example, at room temperature, can be released into the enclosure or package during temperature cycling to higher temperature, such, as, for example, to a temperature of 100° C. Desiccants used within such packaged devices include powders of metal oxides, alkaline earth metal oxides, sulfates, metal halides, or perchlorates, i.e. materials having desirably relatively low values of equilibrium minimum humidity and high moisture capacity. However, such materials often chemically absorb moisture relatively slowly compared to the above-mentioned molecular sieve, silica gel, or Drierite materials. Such relatively slow reaction with water vapor leads to a measurable degree of device degradation of performance following the sealing of the desiccant inside a device cover due to, for example, moisture absorbed on the inside of a device, moisture vapor present within the sealed device, and moisture permeating through the seal between the device and the cover from the outside ambient. In addition, highly moisture-sensitive electronic devices typically cannot be exposed to moisture levels greater than 1000 ppm even during fabrication and encapsulation, requiring control of the moisture levels until the devices are completely encapsulated. For these reasons control of the moisture level during fabrication and encapsulation is required to prevent degradation of performance.

To reduce the quantity of moisture absorbed on the inside of a device or present within the sealed device, highly moisture-sensitive devices, such as organic light-emitting devices (OLED) or panels, polymer light-emitting devices, charge-coupled device (CCD) sensors, and micro-electro-mechanical sensors (MEMS) are often sealed within a low humidity environment, such as a drybox at humidity levels less than 1000 ppm moisture. To ensure low levels of moisture within the sealed device, these highly moisture-sensitive devices are completely sealed within the low humidity environment prior to any additional processing steps, such as, bonding of interconnects, and module assembly. To achieve this low humidity sealing, highly moisture-sensitive devices, such as charge-coupled device (CCD) sensors and micro-electro-mechanical sensors (MEMS), are typically sealed individually as single elements with separate cover elements after separation from a multiple element substrate or wafer. Other devices, such as organic light-emitting devices (OLED), are sealed as multiple devices on a single element; however, in present manufacturing methods individual cover elements of metal or glass are used to seal each device prior to separation. FIG. 3A shows a typical multiple OLED element 34 containing multiple OLED devices 32 on an individual substrate 10, encapsulated with individual encapsulation enclosures 30 and sealing material 20, and FIG. 3B is a schematic sectional view of the multiple OLED element 34 taken along section line 3B—3B of FIG. 3A. Both of the present methods of sealing highly moisture-sensitive devices require significant levels of handling to assemble individual cover elements to either individual device elements or multiple device elements within a low moisture environment.

To reduce the handling of individual cover elements for encapsulation of multiple highly moisture-sensitive device elements within a low moisture environment, a modification of the LCD sealing method can be envisioned where the sealing material between the substrate and the encapsulation enclosure has no gaps prior to bonding. FIG. 4A shows a highly moisture-sensitive electronic device element 14 comprising a substrate 10 containing multiple highly moisture-sensitive electronic devices 12, a single encapsulation enclosure 30 encapsulating all of the highly moisture-sensitive electronic devices 12, and sealing material 20. The problem with this technique is shown schematically in FIG. 4A where the sealing material 20 has been damaged by the high gas pressure inside each seal region produced when the substrate 10 and the encapsulation enclosure 30 are moved to their predetermined spacing after both the substrate and the encapsulation enclosure have contacted the sealing material. This damage typically appears as narrow seal widths or even gaps in the seal, decreasing or eliminating protection of the highly moisture-sensitive electronic devices. FIG. 4B is a schematic sectional view of the highly moisture-sensitive electronic device element 14 taken along section lines 4B—4B of FIG. 4A. It would, therefore, be desirable to have highly moisture-sensitive electronic device elements and a method for fabricating highly moisture-sensitive electronic device elements that does not damage the seals that are required to protect the highly moisture-sensitive electronic devices from moisture during fabrication and encapsulation.

Numerous publications describe methods and/or materials for controlling humidity levels within enclosed or encapsulated electronic devices. For example, Kawami et al., European Patent Application EP 0 776 147 A1 disclose an organic EL element enclosed in an airtight container which contains a drying substance comprised of a solid compound for chemically absorbing moisture. The drying substance is spaced from the organic EL element, and the drying substance is consolidated in a predetermined shape by vacuum vapor deposition, sputtering, or spin-coating. Kawami et al. teach the use of the following desiccants: alkali metal oxides, alkali earth metal oxides, sulfates, metal halides, and perchlorates. Kawami et al., however, do not teach a multiple EL device element with multiple airtight containers nor a method for fabricating a multiple EL device element with multiple airtight containers. The handling and sealing problems and solutions of a multiple EL device element, such as methods to prevent damage to the seal due to high gas pressure inside the seal region during encapsulation, are not discussed nor taught by Kawami et al.

Shores, U.S. Pat. No. 5,304,419, discloses a moisture and particle getter for enclosures which enclose an electronic device. A portion of an inner surface of the enclosure is coated with a pressure sensitive adhesive containing a solid desiccant.

Shores, U.S. Pat. No. 5,401,536, describes a method of providing a moisture-free enclosure for an electronic device, the enclosure containing a coating or adhesive with desiccant properties. The coating or adhesive comprises a protonated alumina silicate powder dispersed in a polymer.

Shores, U.S. Pat. No. 5,591,379, discloses a moisture gettering composition for hermetic electronic devices. The composition is applied as a coating or adhesive to the interior surface of a device packaging, and the composition comprises a water vapor permeable binder which has dispersed therein a desiccant which is preferably a molecular sieve material.

In none of these patents does Shores teach a multiple device element or a method to provide moisture-free enclosures for a multiple device element.

Booe, U.S. Pat. No. 4,081,397, describes a composition used for stabilizing the electrical and electronic properties of electrical and electronic devices. The composition comprises alkaline earth oxides in an elastomeric matrix. Booe does not teach a multiple device element or a method used for stabilizing the electrical and electronic properties of a multiple electrical and electronic device element.

Inohara et al., U.S. Pat. No. 4,357,557, describe a thin-film electroluminescent display panel sealed by a pair of glass substrates for protection from the environment. The method includes a protective liquid introduced between the glass substrates, a spacer positioned for determining the spacing between the pair of substrates, injection holes formed within one of the substrates to withdraw under vacuum the air and gases from the cavity defined by the substrates and to introduce the protective liquid into the cavity, an adhesive adapted to provide bonding between the substrates and the spacer, a moisture absorptive member introduced into the protective liquid, and an adhesive to seal the injection hole. Inohara et al. do not teach a multiple EL device element with multiple airtight containers nor a method for fabricating a multiple EL device element with multiple airtight containers. The handling and sealing problems and solutions of a multiple EL device element, such as methods to prevent damage to the seal due to high gas pressure inside the seal region during encapsulation, are not discussed nor taught by Inohara et al. Although the use of injection holes in one of the substrates will prevent damage to the seal by permitting excess ambient gas to exit through the injection holes during encapsulation, Inohara et al. do not teach this purpose for providing the injection holes. Instead the purpose of the injection holes is to allow introduction of the protective liquid into the cavity defined by the substrates.

Taniguchi et al, U.S. Pat. No. 5,239,228, describe a method for protecting a thin-film electroluminescent device similar to Inohara et al. with the additional feature of a groove in the sealing plate to capture excess adhesive. This groove may also contain a moisture absorption agent. Taniguchi et al. also do not teach a multiple EL device element with multiple airtight containers nor a method for fabricating a multiple EL device element with multiple airtight containers. The handling and sealing problems and solutions of a multiple EL device element, such as methods to prevent damage to the seal due to high gas pressure inside the seal region during encapsulation, are also not discussed nor taught by Taniguchi et al.

Harvey, III et al., U.S. Pat. No. 5,771,562, describe a method of hermetically sealing organic light emitting devices comprising the steps of providing an organic light emitting device on a substrate, overcoating the organic light emitting device with a film of inorganic dielectric material, and sealingly engaging an inorganic layer over the dielectric material. Harvey, III et al. do not teach a multiple OLED device element with multiple airtight containers nor a method for fabricating a multiple OLED device element with multiple airtight containers. Although the inorganic dielectric layer may provide temporary protection from moisture during the encapsulation process, Harvey, III et al. do not teach how this layer can be used to fabricate a multiple OLED device element with multiple airtight containers.

Boroson et al., U.S. Pat. No. 6,226,890, describe a method of desiccating an environment surrounding a highly moisture-sensitive electronic device sealed within an enclosure, including selecting a desiccant comprised of solid particles having a particle size range 0.1 to 200 micrometers. The desiccant is selected to provide an equilibrium minimum humidity level lower than a humidity level to which the device is sensitive within the sealed enclosure. A binder is chosen that maintains or enhances the moisture absorption rate of the desiccant for blending the selected desiccant therein. The binder may be in liquid phase or dissolved in a liquid. A castable blend is formed including at least the desiccant particles and the binder, the blend having a preferred weight fraction of the desiccant particles in the blend in a range of 10% to 90%. The blend is cast in a measured amount onto a portion of an interior surface of an enclosure to form a desiccant layer thereover, the enclosure having a sealing flange. The blend is solidified to form a solid desiccant layer, and the electronic device is sealed with the enclosure along the sealing flange. Boroson et al., however, do not teach a method of desiccating an environment surrounding a multiple highly moisture-sensitive electronic device element sealed within multiple enclosures.

SUMMARY OF THE INVENTION

It is the object of the present invention to provide a highly moisture-sensitive electronic device element having highly moisture-sensitive electronic devices and a method for fabrication of said element in which damage of the moisture-sensitive electronic devices within the element due to moisture is prevented and fabrication of said element is simplified over the present art.

In one aspect, this object is achieved by a highly moisture-sensitive electronic device element having highly moisture-sensitive electronic devices comprising:

a) a substrate containing two or more highly moisture-sensitive electronic devices;

b) an encapsulation enclosure encapsulating all of the highly moisture-sensitive electronic devices on said substrate; and c) sealing material positioned between said substrate and said encapsulation enclosure to form a complete seal between said substrate and said encapsulation enclosure around each highly moisture-sensitive electronic device or around groups of highly moisture-sensitive electronic devices.

In another aspect, this object is achieved by a method of making highly moisture-sensitive electronic device elements having a plurality of highly moisture-sensitive electronic devices such as OLED devices on a single substrate wherein the devices are protected from moisture prior to separating the individual devices from the substrate, comprising the steps of:

a) placing the sealing material completely around each highly moisture-sensitive electronic device or around groups of highly moisture-sensitive electronic devices on the substrate or in positions on the encapsulation enclosure such that after sealing the sealing material will be positioned completely around each highly moisture-sensitive electronic device or around groups of highly moisture-sensitive electronic devices;

b) disposing the substrate and the encapsulation enclosure, one of which contains the sealing material, in close aligned proximity to each other, but spaced apart, in such aligned proximate position providing an initial ambient pressure;

c) providing relative motion between the substrate and the encapsulation enclosure until the sealing material contacts both the substrate and the encapsulation enclosure and the substrate and the encapsulation enclosure are spaced apart within a predetermined range;

d) after or during step c), increasing the ambient pressure above the initial ambient pressure surrounding the substrate, the encapsulation enclosure, and the sealing material, to reduce the pressure difference within spaces defined between the substrate, the encapsulation enclosure, and the sealing material relative to the increased ambient pressure, to thereby prevent deformation of the sealing material; and e) bonding the sealing material to both the substrate and the encapsulation enclosure to form the multiple highly moisture-sensitive electronic device elements.

The elements and methods for fabrication of the elements in accordance with the present invention of highly moisture-sensitive electronic device elements having highly moisture-sensitive electronic devices and methods for their fabrication to prevent premature device failure or premature degradation of device performance provides the following advantages over prior art methods: reduced handling of devices and encapsulation enclosures by sealing all of the highly moisture-sensitive devices on a single substrate as a single element with a single encapsulation enclosure encapsulating all of the highly moisture-sensitive electronic devices on the substrate prior to separating into smaller single or multiple device elements; improved protection from moisture prior to exposure to ambient environments; improved compatibility with automated processes required for high volume manufacturing; improved compatibility with processing inside a low moisture environment; and reduction in encapsulation defects due to pressure differentials inside and outside the highly moisture-sensitive electronic devices.

DETAILED DESCRIPTION OF THE INVENTION

The term "highly moisture-sensitive electronic device element" is employed to designate an element that contains one or more highly moisture-sensitive electronic devices during or after fabrication, or both, during and after fabrication of the highly moisture-sensitive electronic devices is complete. The term "highly moisture-sensitive electronic device" is employed to designate any electronic device that is susceptible to a measurable degradation of device performance at ambient moisture levels greater than 1000 ppm. The term "substrate" is employed to designate organic, inorganic, or combination organic and inorganic solids on which one or more highly moisture-sensitive electronic devices are fabricated. The term "encapsulation enclosure" is employed to designate organic, inorganic, or combination organic and inorganic solids used to protect one or more highly moisture-sensitive electronic devices from moisture by preventing or limiting moisture permeation through the encapsulation enclosures.

The term "sealing material" is employed to designate organic, inorganic, or combination organic and inorganic materials used to bond encapsulation enclosures to substrates and to protect one or more highly moisture-sensitive electronic devices from moisture by preventing or limiting moisture permeation through the sealing materials. The term "gap" is employed to designate a discontinuity in the sealing material surrounding one or more electronic devices. The term "water absorbing material" is employed to designate inorganic materials used to physically or chemically absorb or react with moisture that would otherwise damage the highly moisture-sensitive electronic devices. The term "temporary moisture protection layer" is employed to designate organic, inorganic, or combination organic and inorganic materials used to prevent or limit moisture induced damage to the highly moisture-sensitive electronic devices during short term exposure to ambient moisture levels greater than 1000 ppm, where short term is typically less than 10 days.

Figure 1A:
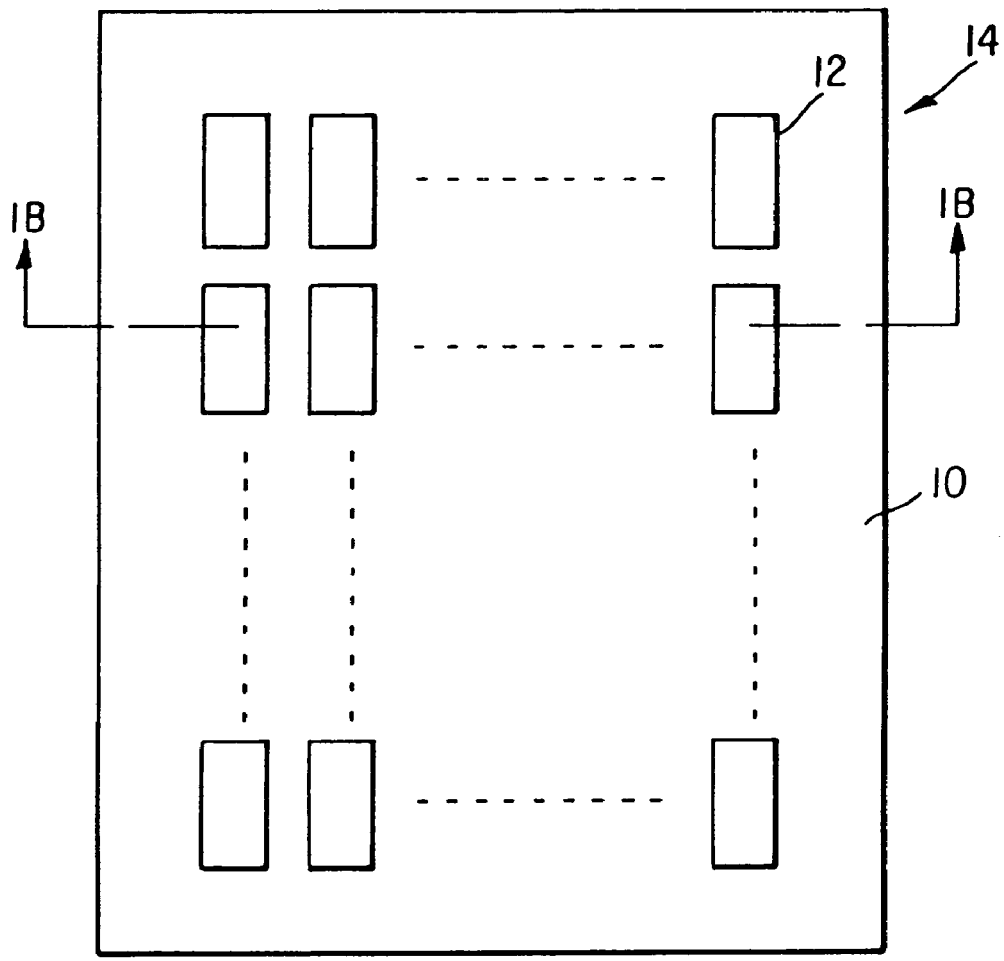
FIG. 1A shows an unencapsulated highly moisture-sensitive electronic device element containing multiple highly moisture-sensitive electronic devices on a substrate.
Figure 1B:
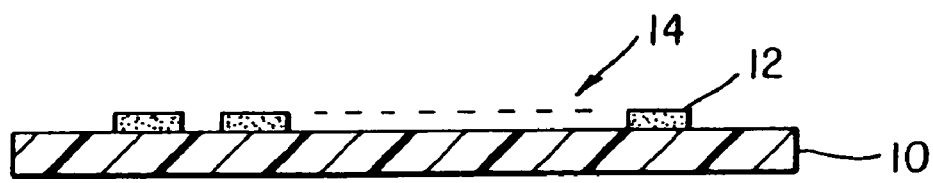
FIG. 1B is a schematic sectional view of the highly moisture-sensitive electronic device element taken along section line 1B—1B of FIG. 1A.
Figure 2A:
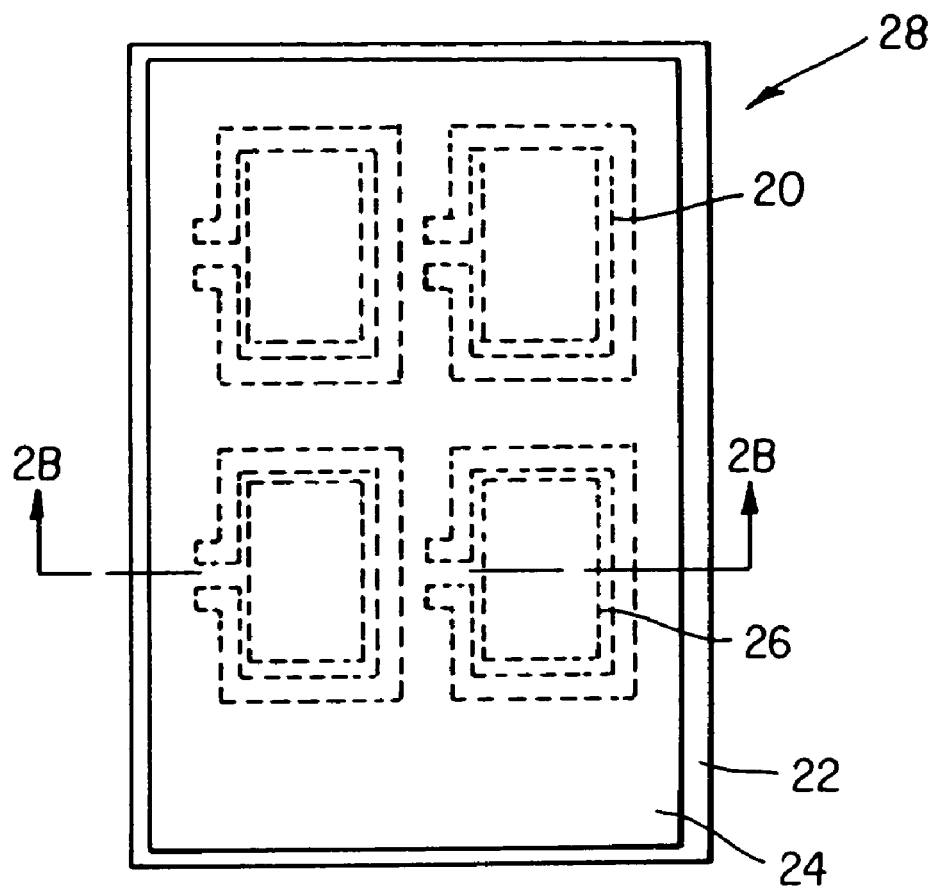
FIG. 2A shows a typical multiple LCD element before separation into single LCD devices.
Figure 2B:
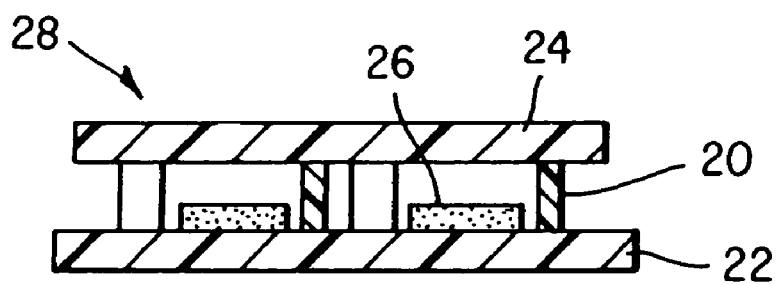
FIG 2B is a schematic sectional view of the multiple LCD element taken along section line 2B—2B of FIG. 2A.
Figure 3A:
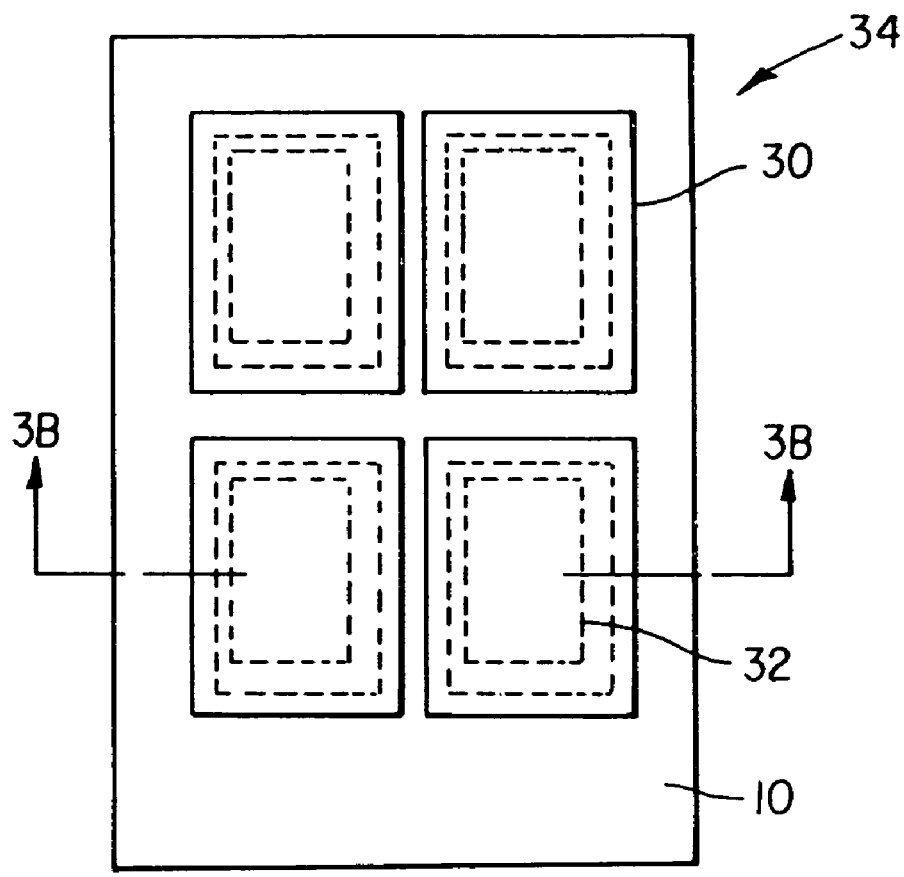
FIG. 3A shows a typical individually encapsulated multiple OLED element.
Figure 3B:
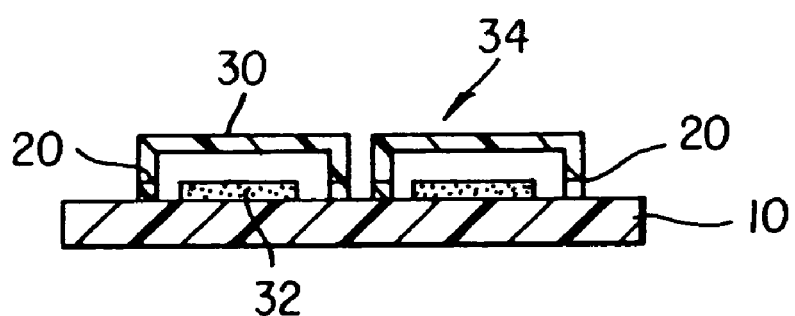
FIG. 3B is a schematic sectional view of the multiple OLED element taken along section line 3B—3B of FIG. 3A.
Figure 4A:
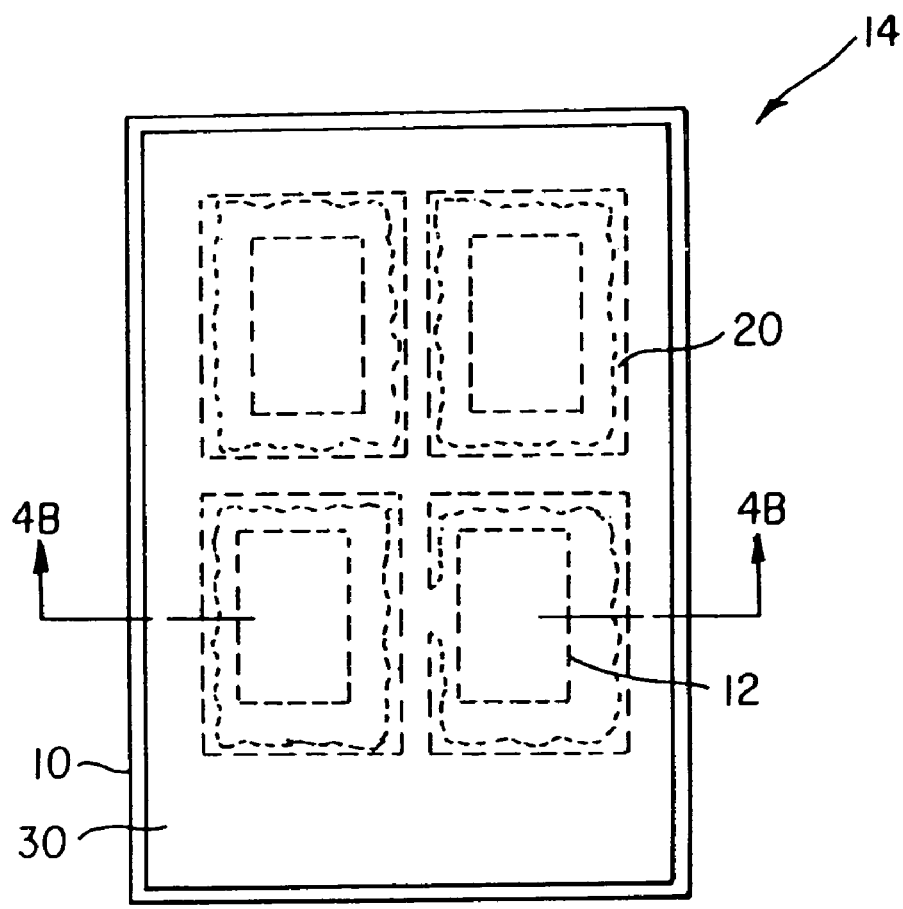
FIG. 4A shows a highly moisture-sensitive electronic device element comprising a single encapsulation enclosure and sealing material with damage due to excess pressure.
Figure 4B:
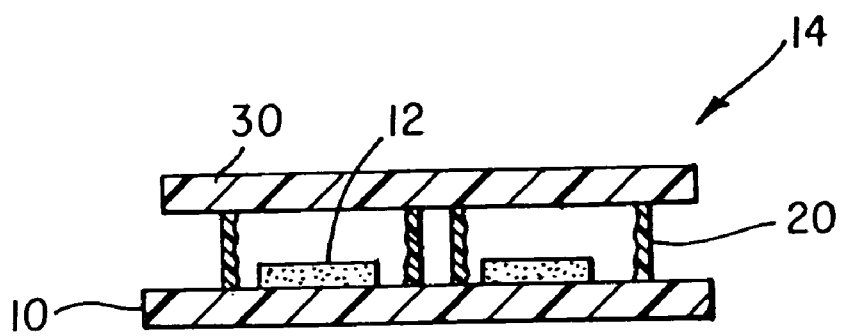
FIG. 4B is a schematic sectional view of the highly moisture-sensitive electronic device element taken along section lines 4B—4B of FIG. 4A.
Figure 5A:
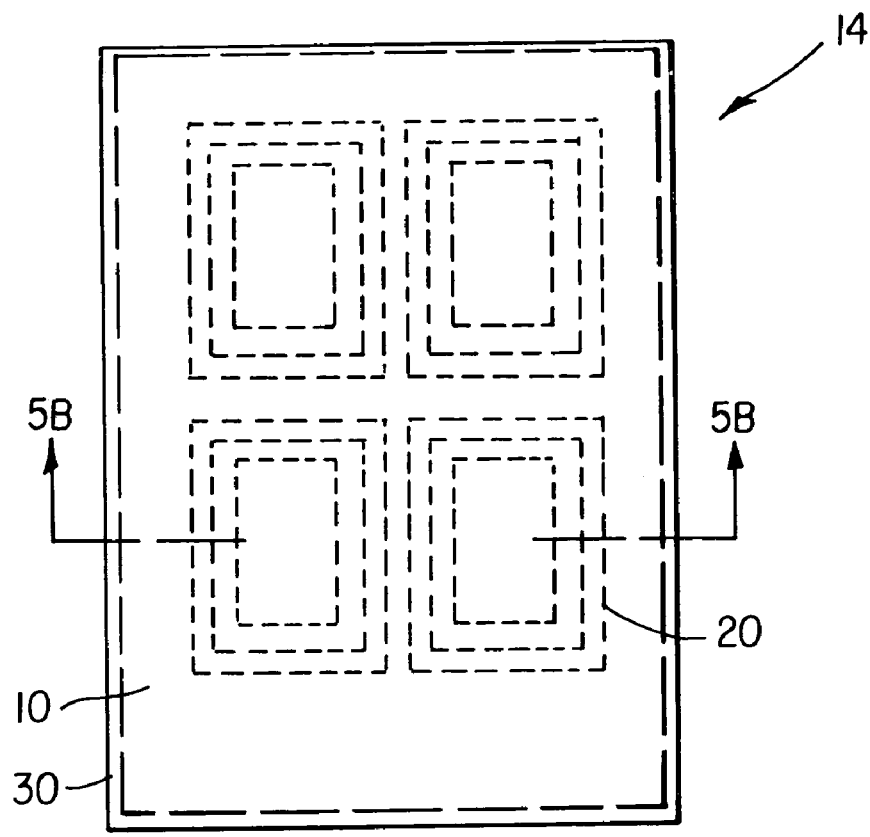
FIG. 5A shows a highly moisture-sensitive electronic device element comprising a substrate containing multiple highly moisture-sensitive electronic devices, a single encapsulation enclosure, and sealing material.
Figure 5B:
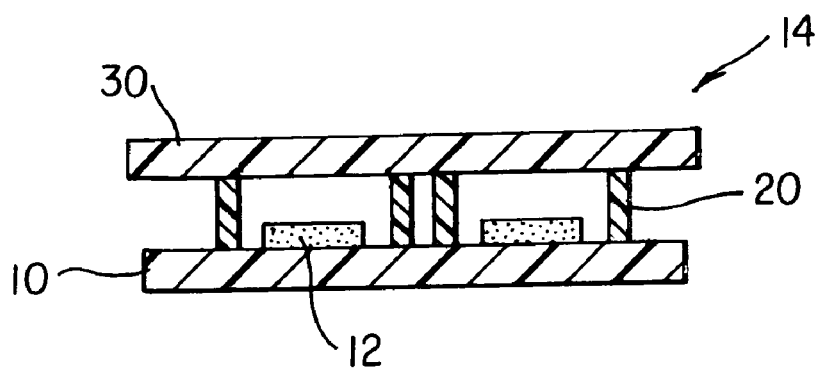
FIG. 5B is a schematic sectional view of the highly moisture-sensitive electronic device element taken along section lines 5B—5B of FIG. 5A.

Referring now to FIG. 5A, there is shown one embodiment of the highly moisture-sensitive electronic device element 14 in accordance with the present invention. A highly moisture-sensitive electronic device element 14 is shown comprising a substrate 10 containing multiple highly moisture-sensitive electronic devices 12, a single encapsulation enclosure 30 encapsulating all of the highly moisture-sensitive electronic devices 12 on the substrate 10, and sealing material 20 surrounding each highly moisture-sensitive electronic device 12 with no gaps in the sealing material 20. FIG. 5B is a schematic sectional view of the highly moisture-sensitive electronic device element 14 taken along section lines 5B—5B of FIG. 5A. In FIG. 5A and FIG. 5B, the highly moisture-sensitive electronic device element 14 is shown comprising four highly moisture-sensitive electronic devices 12, but the highly moisture-sensitive electronic device element of this invention may comprise any number of highly moisture-sensitive electronic devices greater than one. By encapsulating all of the highly moisture-sensitive electronic devices on the substrate with a single encapsulation enclosure, the advantage of reduced handling over the prior art of separately encapsulating each highly moisture-sensitive electronic device on the substrate with separate encapsulation enclosures is achieved. The substrate 10 and the encapsulation enclosure 30 shown in FIG. 5A and FIG. 5B may be an organic solid, an inorganic solid, or a combination of organic and inorganic solids. The substrate and the encapsulation enclosure may be rigid or flexible and may be processed as separate individual pieces, such as sheets or wafers, or as continuous rolls. Typical substrate and the encapsulation enclosure materials include glass, plastic, metal, ceramic, semiconductor, metal oxide, metal nitride, metal sulfide, semiconductor oxide, semiconductor nitride, semiconductor sulfide, carbon or combinations thereof. The substrate and the encapsulation enclosure may be a homogeneous mixture of materials, a composite of materials, or multiple layers of materials. The sealing material 20 shown in FIG. 5A and FIG. 5B surrounds each individual highly moisture-sensitive electronic device, but the sealing material could also surround groups of two or more highly moisture-sensitive electronic devices if the final product required more than one highly moisture-sensitive electronic device within a single element. In addition, the sealing material surrounding each highly moisture-sensitive electronic device or groups of highly moisture-sensitive electronic devices contains no gaps, such that the highly moisture-sensitive electronic device element is protected from moisture prior to separating into smaller single or multiple device elements. The sealing material may be organic, inorganic, or a combination of organic and inorganic. The sealing material may be bonded to the substrate and the encapsulation enclosure by melting and cooling or by reaction curing. Typical materials bonded by melting and cooling include glass; hot melt adhesives such as polyolefins, polyesters, polyamides, or combinations thereof; or inorganic solders such as indium, tin, lead, silver, gold, or combinations thereof. Typical reaction curing methods include reactions resulting from heat, radiation such as UV radiation, mixing of two or more components, exposure to ambient moisture, removal of ambient oxygen, or combinations thereof. Typical materials bonded by reaction curing include acrylates, epoxies, polyurethanes, silicones, or combinations thereof. Other inorganic material typically used in sealing materials include glass, ceramic, metal, semiconductor, metal oxide, semiconductor oxide, or combinations thereof.

Figure 6A:
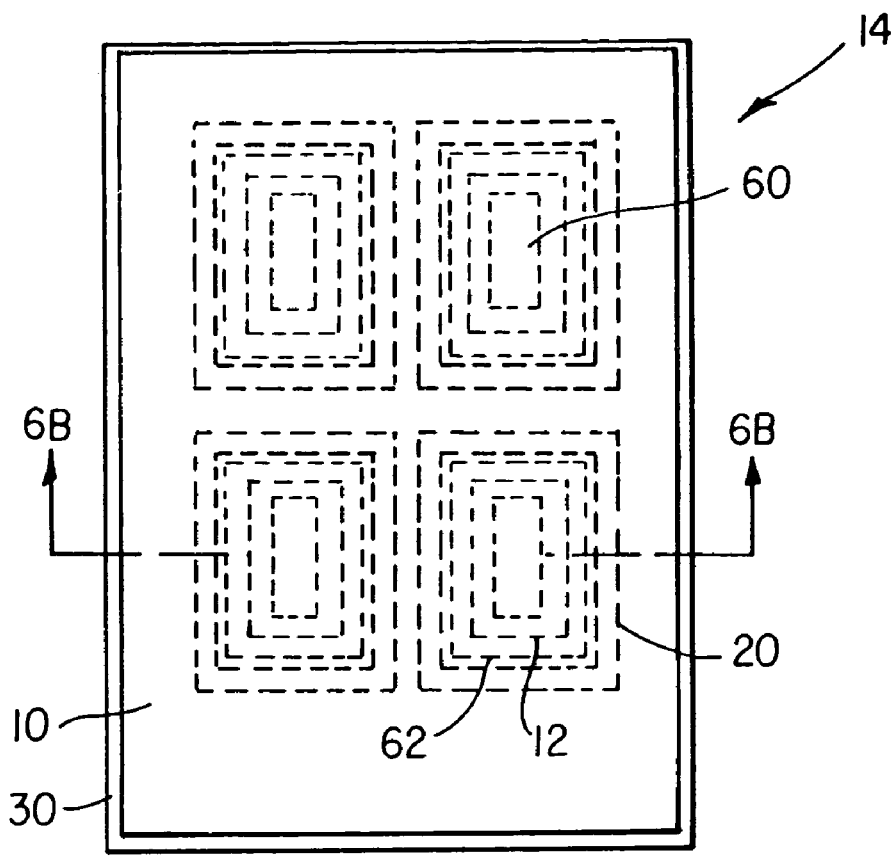
FIG. 6A shows a highly moisture-sensitive electronic device element comprising a substrate containing multiple highly moisture-sensitive electronic devices, a single encapsulation enclosure, sealing material, water absorbing material, and a temporary moisture protection layer.
Figure 6B:
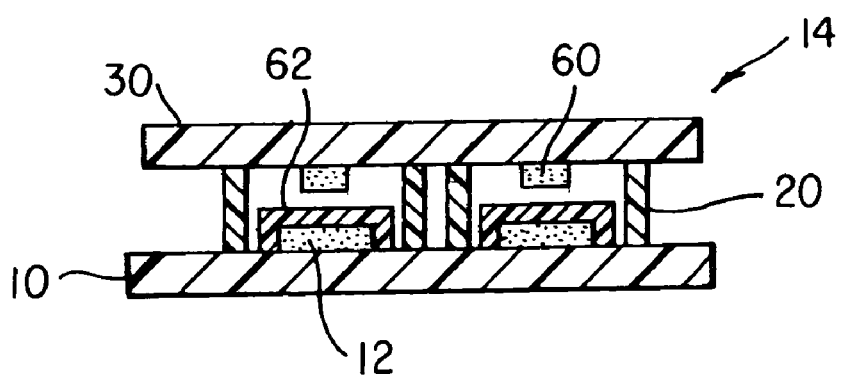
FIG. 6B is a schematic sectional view of the highly moisture-sensitive electronic device element taken along section lines 6B—6B of FIG. 6A.

Referring now to FIG. 6A, there is shown another embodiment of the highly moisture-sensitive electronic device element 14 in accordance with the present invention. A highly moisture-sensitive electronic device element 14 is shown comprising a substrate 10 containing multiple highly moisture-sensitive electronic devices 12, a single encapsulation enclosure 30 encapsulating all of the highly moisture-sensitive electronic devices 12 on the substrate 10, sealing material 20 defining a space surrounding each highly moisture-sensitive electronic device 12 with no gaps in the sealing material 20, water absorbing material 60 positioned between the substrate 10 and the encapsulation enclosure 30 and within the space defined by the sealing material 20, and temporary moisture protection layers 62 coated over each of the highly moisture-sensitive electronic devices 12. FIG. 6B is a schematic sectional view of the highly moisture-sensitive electronic device element 14 taken along section lines 6B—6B of FIG. 6A. Details of the highly moisture-sensitive electronic devices 12, substrate 10, encapsulation enclosure 30, and sealing material 20 are identical with the embodiment shown in FIG. 5A and FIG. 5B. The water absorbing material is used to physically or chemically absorb or react with moisture that would otherwise damage the highly moisture-sensitive electronic devices. Typical water absorbing materials include alkaline metal oxides, alkaline earth metal oxides, sulfates, metal halides, perchlorates, molecular sieves, and metals with work functions less than 4.5 eV and capable of being oxidized in the presence of moisture, or combinations thereof. Water absorbing material may be packaged within moisture permeable containers or binders. The water absorbing material may be a single material, a homogeneous mixture of materials, a composite of materials, or multiple layers of materials. Temporary moisture protection layers are used to prevent or limit moisture induced damage to the highly moisture-sensitive electronic devices during short term exposure to ambient moisture levels greater than 1000 ppm. The temporary moisture protection layer is organic material, inorganic material, or a combination thereof. Typical organic materials include epoxies, polyurethanes, polyureas, acrylates, silicones, polyamides, polyimides, phenolics, polyvinyls, phenoxies, polysulfones, polyolefins, polyesters, or combinations thereof. Typical inorganic materials include glass, ceramic, metal, semiconductor, metal oxide, metal nitride, metal sulfide, semiconductor oxide, semiconductor nitride, semiconductor sulfide, carbon or combinations thereof. The temporary moisture protection layer may be a single material, a homogeneous mixture of materials, a composite of materials, or multiple layers of materials.

Figure 7A:
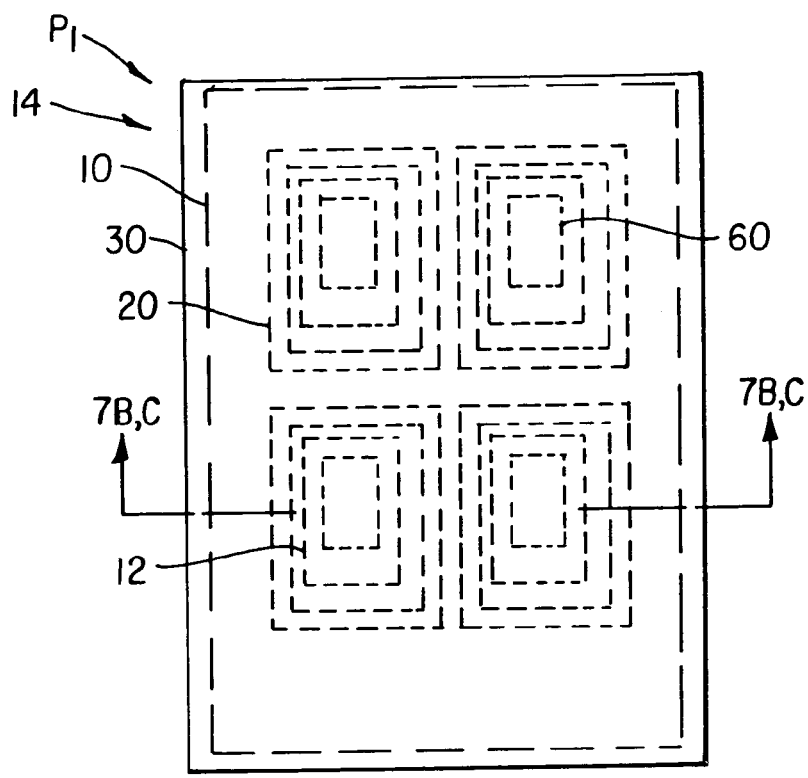
FIG. 7A shows a highly moisture-sensitive electronic device element at an initial ambient pressure $P_1$, comprising a substrate containing multiple highly moisture-sensitive electronic devices and sealing material with no gaps in close aligned proximity to, but spaced apart from, an encapsulation enclosure containing water absorbing material.
Figure 7B:
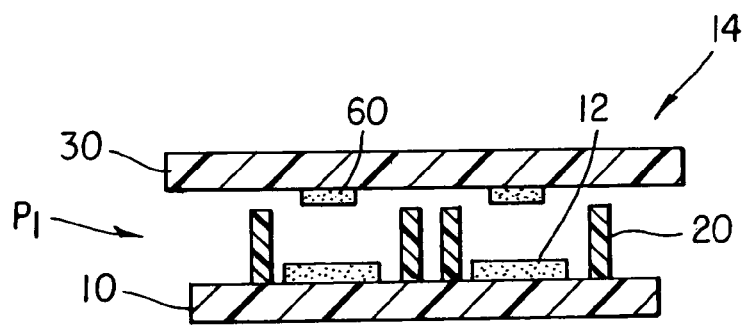
FIG. 7B is a schematic sectional view of the highly moisture-sensitive electronic device element taken along section lines 7B,C—7B,C of FIG. 7A.
Figure 7C:
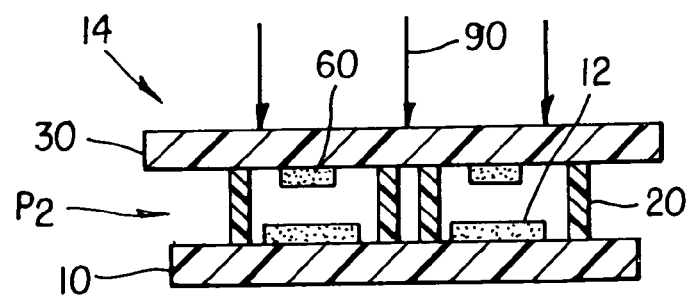
FIG. 7C is a schematic sectional view of the highly moisture-sensitive electronic device element taken along section lines 7B,C—7B,C of FIG. 7A after relative motion of the substrate and the encapsulation enclosure to the point where the sealing material contacts both the substrate and the encapsulation enclosure and the ambient pressure is $P_2$.
Figure 7D:
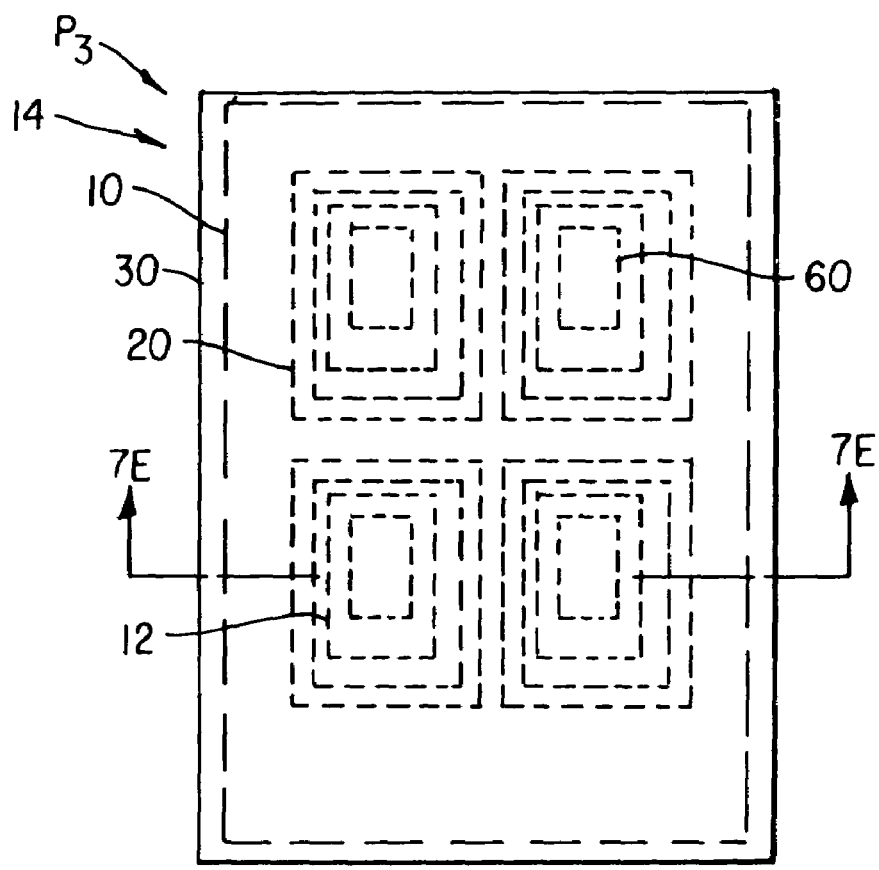
FIG. 7D shows a highly moisture-sensitive electronic device element at a final ambient pressure $P_3$, comprising a substrate containing multiple highly moisture-sensitive electronic devices, sealing material, an encapsulation enclosure, and water absorbing material after relative motion of the substrate and the encapsulation enclosure to a predetermined spacing.
Figure 7E:
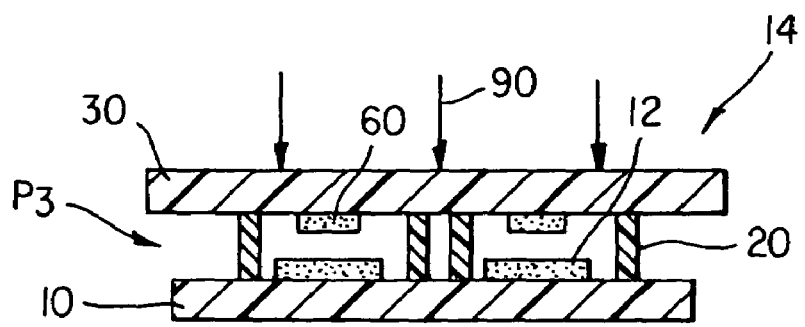
FIG. 7E is a schematic sectional view of the highly moisture-sensitive electronic device element taken along section lines 7E—7E of FIG. 7D.

Referring now to FIGS. 7A to 7E, there is shown an embodiment of the method of making highly moisture-sensitive electronic device elements such as OLED devices on a single substrate wherein the devices are protected from moisture prior to separating the individual devices from the substrate in accordance with the present invention. FIG. 7A shows a highly moisture-sensitive electronic device element 14 at an initial ambient pressure $P_1$ comprising a substrate 10 containing multiple highly moisture-sensitive electronic devices 12 and sealing material 20 surrounding each highly moisture-sensitive electronic device 12 with no gaps in the sealing material 20 in close aligned proximity to, but spaced apart from, an encapsulation enclosure 30 encapsulating all of the highly moisture-sensitive electronic devices 12 on the substrate 10 and containing water absorbing material 60 in positions such that after bonding, the water absorbing material will be positioned within each moisture-sensitive electronic. FIG. 7B is a schematic sectional view of the highly moisture-sensitive electronic device element 14 taken along section lines 7B,C—7B,C of FIG. 7A. The initial ambient pressure $P_1$ may be above, below, or equal to atmospheric pressure. Details of the highly moisture-sensitive electronic devices 12, substrate 10, encapsulation enclosure 30, sealing material 20, and water absorbing material 60 are identical with the embodiments shown in FIGS. 5A, 5B, 6A and 6B. In another embodiment, the temporary moisture protection layer 62 described in detail in FIG. 6A and 6B may be coated on the highly moisture-sensitive electronic devices 12 as a replacement for, or in addition to, the use of water absorbing material 60. In yet another embodiment, the highly moisture-sensitive electronic device element 14 comprises highly moisture-sensitive electronic devices 12, a substrate 10, an encapsulation enclosure 30, and sealing material 20. FIG. 7C is a schematic sectional view of the highly moisture-sensitive electronic device element 14 taken along section lines 7B,C—7B,C of FIG. 7A after relative motion 90 of the substrate 10 and the encapsulation enclosure 30 to the point where the sealing material 20 contacts both the substrate 10 and the encapsulation enclosure 30 and the ambient pressure is $P_2$. The ambient pressure $P_2$ may be equal to or greater than the initial ambient pressure $P_1$. FIG. 7D shows a highly moisture-sensitive electronic device element 14 at a final ambient pressure $P_3$, after relative motion between the substrate 10 and the encapsulation enclosure 30 until the substrate 10 and the encapsulation enclosure 30 are spaced apart within a predetermined range and after bonding the sealing material 20 to both the substrate 10 and the encapsulation enclosure 30 to form the multiple highly moisture-sensitive electronic devices 12. The ambient pressure $P_3$ may be equal to or greater than the ambient pressure $P_2$. The ambient pressure $P_3$ is increased, relative to the initial ambient pressure $P_1$ surrounding the substrate 10, the encapsulation enclosure 30, and the sealing material 20, to reduce the pressure difference within spaces defined between the substrate 10, the encapsulation enclosure 30, and the sealing material 20 relative to the increased ambient pressure $P_3$, to thereby prevent deformation of the sealing material 20. Bonding the sealing material 20 to both the substrate 10 and the encapsulation enclosure 30 may be accomplished by melting and cooling, reaction curing, or a combination thereof. The reaction curing may include reactions resulting from heat, radiation, mixing of two or more components, exposure to ambient moisture, removal of ambient oxygen, or combinations thereof. FIG. 7E is a schematic sectional view of the highly moisture-sensitive electronic device element taken along section lines 7E—7E of FIG. 7D. After completing the method described in FIG. 7A to 7E, the highly moisture-sensitive electronic devices are typically separated into individual devices or groups of devices having a portion of the initial substrate.

EXAMPLE

I. Construction of the Test Structure

A plurality of identical test structures were fabricated by the following process sequence:

(1) glass substrates representing substrates containing multiple highly moisture-sensitive electronic devices were cleaned by ultrasonicating in acetone and isopropyl alcohol and rinsing in distilled water;

(2) glass encapsulation enclosures containing multiple cavities formed by selectively etching the glass substrate were cleaned, prior to forming a water absorbing layer, by a cleaning process identical to the substrate cleaning process described in step (1) above;

(3) water absorbing layers were formed and cured within the cavities of the encapsulation enclosures;

(4) sealing material was placed completely around each cavity on the encapsulation enclosure;

(5) the substrate and the encapsulation enclosure containing the sealing material were placed in close aligned proximity to each other, but spaced apart at an initial ambient pressure;

(6) relative motion between the substrate and the encapsulation enclosure was provided until the sealing material contacted both the substrate and the encapsulation enclosure and the substrate and the encapsulation enclosure were spaced apart by 20–30 micrometers;

(7) after or during step (6), the ambient pressure surrounding the substrate, the encapsulation enclosure, and the sealing material was either increased or held constant; and (8) the sealing material was bonding to both the substrate and the encapsulation enclosure to form the test structure.

II. Results

The quality of the encapsulation for all locations within the test structure was judged based on the quality of the sealing material after bonding. If damage was evident to the seal material due to pressure differences inside and outside the sealing material, the encapsulation quality was rated as poor. If no damage was evident, the encapsulation quality was rated as good. If slight damage was evident, the encapsulation quality was rated as fair.

| Seal Dimensions L × W × T (mm) | Initial Pressure (Vac. gauge, Torr) | Final Pressure (Vac. gauge, Torr) | Encapsulation Quality |
| --- | --- | --- | --- |
| 100 × 1.5 × 0.02 | 760 | 760 | Poor |
| 100 × 1.5 × 0.02 | 525 | 760 | Poor |
| 100 × 1.5 × 0.02 | 625 | 760 | Poor |
| 100 × 1.5 × 0.02 | 580 | 760 | Excellent |
| 170 × 1.5 × 0.02 | 760 | 760 | Poor |
| 170 × 1.5 × 0.02 | 525 | 760 | Poor |
| 170 × 1.5 × 0.02 | 735 | 760 | Poor |
| 170 × 1.5 × 0.02 | 625 | 760 | Excellent |

The results show that the optimal initial and final pressure determines the encapsulation quality and depends on the size of the encapsulation space as shown by the seal dimensions. For any particular seal dimension there will be multiple sets of initial and final pressures that will result in high quality encapsulations, and there will be an operating range within each set of pressures that results in high quality encapsulations. The conditions shown in the table show only one set of pressures for each seal dimension that results in high quality encapsulations.

The invention has been described in detail with particular reference to certain preferred embodiments thereof, but it will be understood that variations and modifications can be effected within the spirit and scope of the invention.

PARTS LIST 10 substrate
12 highly moisture-sensitive electronic device
14 highly moisture-sensitive electronic device element
20 sealing material
22 LCD back-plane substrate
24 LCD front-plane substrate
26 LCD back-plane electronics
28 multiple LCD element
30 encapsulation enclosure
32 OLED device
34 multiple OLED element
60 water absorbing material
62 temporary moisture protection layer
90 relative motion arrows
$P_1$ initial ambient pressure
$P_2$ ambient pressure when sealing material contacts both the substrate and the encapsulation enclosure
$P_3$ ambient pressure when substrate and encapsulation enclosure are at their final predetermined spacing

What is claimed is:

1. A highly moisture-sensitive electronic device element having a plurality of highly moisture-sensitive electronic devices, comprising:

a) a substrate on which are formed the highly moisture-sensitive electronic devices;

b) a single encapsulation enclosure encapsulating all of the highly moisture-sensitive electronic devices on said substrate to protect the highly moisture-sensitive electronic devices from moisture;

c) sealing material that extends from said substrate and to said encapsulation enclosure around each highly moisture-sensitive device to form a complete seal between said substrate and said encapsulation enclosure around each highly moisture-sensitive device and thereby forming a separate sealed space around each highly moisture-sensitive electronic device; and d) water absorbing material positioned in each space and spaced from each associated highly moisture-sensitive electronic device.

2. The highly moisture-sensitive electronic device element of claim 1, wherein the substrate includes rigid or flexible: glass, plastic, metal, ceramic, semiconductor, metal oxide, metal nitride, metal sulfide, semiconductor oxide, semiconductor nitride, semiconductor sulfide, carbon or combinations thereof.

3. The highly moisture-sensitive electronic device element of claim 1, wherein the encapsulation enclosure includes rigid or flexible: glass, plastic, metal, ceramic, semiconductor, metal oxide, metal nitride, metal sulfide, semiconductor oxide, semiconductor nitride, semiconductor sulfide, carbon or combinations thereof.

4. The highly moisture-sensitive electronic device element of claim 1, wherein the scaling material is organic material, inorganic material, or combinations thereof that is melted and cooled or reaction cured.

5. The highly moisture-sensitive electronic device element of claim 4, wherein reaction curing includes reactions resulting from heat radiation, mixing of two or more components, exposure to ambient moisture, removal of ambient oxygen, or combinations thereof.

6. The highly moisture-sensitive electronic device element of claim 4, wherein the organic material is selected from the group consisting of epoxies, polyurethanes, acrylates, silicones, polyamides, polyolefins, and polyesters, or combinations thereof.

7. The highly moisture-sensitive electronic device element of claim 4, wherein the inorganic material is selected from the group consisting of glass, ceramic, metal, semiconductor, metal oxide, semiconductor oxide, and metal solder, or combinations thereof.

8. The highly moisture-sensitive electronic device element of claim 1, wherein the water absorbing material is selected from the group consisting of alkaline metal oxides, alkaline earth metal oxides, sulfates, metal halides, perchiorates, molecular sieves, and metals, or combinations thereof.

9. A highly moisture-sensitive electronic device element having a plurality of highly moisture-sensitive electronic devices comprising:
   a) a substrate on which is are formed the moisture-sensitive electronic devices that have been coated with a temporary moisture protection layer;
   b) a single encapsulation enclosure encapsulating all of the highly moisture-sensitive electronic devices on said substrate to protect the highly moisture-sensitive electronic devices from moisture;
   c) sealing material extending from said substrate and to said encapsulation enclosure around each highly moisture-sensitive device to form a complete seal between said substrate and said encapsulation enclosure around each highly moisture-sensitive device and thereby forming a separate sealed space around each highly moisture-sensitive electronic device; and
   d) water absorbing material positioned in each space and spaced from each associated highly moisture-sensitive electronic device.

10. The highly moisture-sensitive electronic device element of claim 9, wherein the substrate includes rigid or flexible: glass, plastic, metal, ceramic, semiconductor, metal oxide, metal nitride, metal sulfide, semiconductor oxide, semiconductor nitride, semiconductor sulfide, carbon or combinations thereof.

11. The highly moisture-sensitive electronic device element of claim 9, wherein the encapsulation enclosure includes rigid or flexible: glass, plastic, metal, ceramic, semiconductor, metal oxide, metal nitride, metal sulfide, semiconductor oxide, semiconductor nitride, semiconductor sulfide, carbon or combinations thereof.

12. The highly moisture-sensitive electronic device element of claim 9, wherein the sealing material is organic material, inorganic material, or combinations thereof that is melted and cooled or reaction cured.

13. The highly moisture-sensitive electronic device element of claim 12, wherein reaction curing includes reactions resulting front heat, radiation, mixing of two or more components, exposure to ambient moisture, removal of ambient oxygen, or combinations thereof.

14. The highly moisture-sensitive electronic device element of claim 12, wherein the organic material is selected from the group consisting of epoxies, polyurethanes, acrylates, silicones, polyamides, polyolefins, and polyesters, or combinations thereof.

15. The highly moisture-sensitive electronic device element of claim 12, wherein the inorganic material is selected from the group consisting of glass, ceramic, metal, semiconductor, metal oxide, semiconductor oxide, and metal solder, or combinations thereof.

16. The highly moisture-sensitive electronic device element of claim 9, wherein the temporary moisture protection layer is organic material, inorganic material, or a combination thereof.

17. The highly moisture-sensitive electronic device element of claim 16, wherein the organic material is selected from the group consisting of epoxies, polyuretbanes, polyureas, acrylates, silicones, polyamides, polyimides, phenolics, polyvinyls, phenoxies, polysulfones, polyolefins, and polyesters, or combinations thereof.

18. The highly moisture-sensitive electronic device element of claim 16, wherein the inorganic material is selected from the group consisting of glass, ceramic, metal, semiconductor, metal oxide, metal nitride, metal sulfide, semiconductor oxide, semiconductor nitride, semiconductor sulfide, and carbon or combinations thereof.

19. The highly moisture-sensitive electronic device clement of claim 9, wherein the water absorbing material has work functions less than 4.5 eV and is capable of being oxidized in the presence of moisture.

20. The highly moisture-sensitive electronic device element of claim 9, whercin the water absorbing material is selected from the group consisting of alkaline metal oxides, alkaline earth metal oxides, sulfates, metal halides, perchlorates, molecular sieves, and metals, or combinations thereof.

* * * * *

UNITED STATES PATENT AND TRADEMARK OFFICE
CERTIFICATE OF CORRECTION

PATENT NO. : 7,091,605 B2  Page 1 of 1
APPLICATION NO. : 09/957851
DATED : August 15, 2006
INVENTOR(S) : Michael L. Boroson et al.

It is certified that error appears in the above-identified patent and that said Letters Patent is hereby corrected as shown below:

Column 13, line 43    After the word "which" delete the word "is".

Signed and Sealed this

Twenty-eighth Day of November, 2006

JON W. DUDAS
*Director of the United States Patent and Trademark Office*